United States Patent
Roehr et al.

(10) Patent No.: US 7,372,716 B2
(45) Date of Patent: May 13, 2008

(54) MEMORY HAVING CBRAM MEMORY CELLS AND METHOD

(75) Inventors: Thomas Roehr, Aschheim (DE); Ralf Symanczyk, Munich (DE); Michael Kund, Tuntenhausen (DE)

(73) Assignee: Infineon Technologies AG, Munich (DE)

( * ) Notice: Subject to any disclaimer, the term of this patent is extended or adjusted under 35 U.S.C. 154(b) by 133 days.

(21) Appl. No.: 11/209,424

(22) Filed: Aug. 23, 2005

(65) Prior Publication Data
US 2006/0062043 A1  Mar. 23, 2006

(30) Foreign Application Priority Data
Aug. 23, 2004  (DE) .................. 10 2004 040 750

(51) Int. Cl.
*G11C 17/00* (2006.01)
(52) U.S. Cl. ......................... 365/104; 365/102
(58) Field of Classification Search ............... 365/104, 365/102
See application file for complete search history.

(56) References Cited

U.S. PATENT DOCUMENTS

| | | | | |
|---|---|---|---|---|
| 5,491,665 A | * | 2/1996 | Sachdev | ............... 365/201 |
| 6,333,878 B2 | * | 12/2001 | Ooishi | ............... 365/200 |
| 6,560,135 B2 | | 5/2003 | Matsuoka et al. | |
| 2002/0075743 A1 | * | 6/2002 | Ooishi et al. | ............ 365/225.7 |
| 2003/0047767 A1 | * | 3/2003 | Luetzen et al. | ............. 257/301 |
| 2004/0031974 A1 | * | 2/2004 | Bross | ........................ 257/213 |
| 2005/0012697 A1 | * | 1/2005 | Suzuki | ........................ 345/76 |
| 2007/0053224 A1 | * | 3/2007 | Happ et al. | ............ 365/185.17 |

FOREIGN PATENT DOCUMENTS

DE  10 2004 019 860.8  *  4/2004
WO  00/48196  8/2000

OTHER PUBLICATIONS

T. Mikolajick, C.U.Pinnow, "The Future of Nonvolatile Memories," Non-Volatile Memory Technology Symposium 2002, Honolulu Hawaii, Nov. 4-6, 2002, http://klabs.org/richcontent/MemoryContent/nvmt symp/nvmts2002/docs/02/02 mik olajic s.pdf.

* cited by examiner

*Primary Examiner*—Thong Q. Le
(74) *Attorney, Agent, or Firm*—Dicke, Billig & Czaja, PLLC

(57) ABSTRACT

A memory cell arrangement has a plurality of memory cells of the CBRAM type and a programming apparatus, the memory cells being arranged along bit lines and each bit line having a programming apparatus. The invention provides for the programming apparatus to comprise a charge storage device and a switchable charging apparatus. The inventive method for programming memory cells of the CBRAM type is carried out in such a manner that, a given quantity of an electrical charge is stored in a charge storage device, and the stored quantity of electrical charge is transferred to the memory cell to be programmed.

14 Claims, 3 Drawing Sheets

MEMORY HAVING CBRAM MEMORY CELLS AND METHOD

CROSS-REFERENCE TO RELATED APPLICATIONS

This Utility Patent Application claims priority to German Patent Application No. DE 10 2004 040 750.9, filed on Aug. 23, 2004, which is incorporated herein by reference.

FIELD OF THE INVENTION

The present invention relates to a memory cell arrangement having memory cells of the CBRAM type and also to a method for programming memory cells of the CBRAM type.

BACKGROUND

The article "Electrical Characterization of Solid State Ionic Memory Elements" by Symanczyk, Balakrishnan, Gopalan, Happ, Kozicki, Kund, Mikolajick, Mitkova, Park, Pinnow, Robertson and Ufert, published in 2003 in "Proceedings NVMTS 2003", pages 16ff, discloses a memory arrangement of the generic type. The article also discloses a method for programming memory cells of the CBRAM type. It should be mentioned in this case, by way of explanation, that the term "Ionic Memory Element" and also the term "Programmable Metallization Cell" (abbreviated to "PMC") are generally used in the article to denote the term "CBRAM" ("Conductive Bridging" RAM) that is used in the present case. Since the fundamentals of how memory cells of the CBRAM type are constructed, of the chemico-physical processes on which their operation is based and of how they need to be operated in order to able to store information in them (=in order to be able to program them) have already been prepublished in the article, this information will be assumed to be generally known in specialist circles in the text below and will not be explained again in detail.

The article has likewise already disclosed that it is highly problematic to define and then comply with the electrical parameters of such memory cells when programming the latter. In particular, applying a voltage or voltage pulses which cause a memory cell to be "changed over" (=programmed) from a high nonreactive resistance (typical values for this are of the order of magnitude of $10^{10}$ to $10^{12}$ ohms) to a low nonreactive resistance (typical values for this are of the order of magnitude of $10^4$ to $10^6$ ohms) makes it necessary to monitor the flow of current (which occurs in the process) very closely and to limit it to a value at which a respective memory cell does not sustain any damage, not even in the form of degradation damage (which is usually noticeable only at a very much later date). In the abovementioned article, programming is apparently effected using current limiting. The disadvantage of this, however, is that current-limiting circuits generally operate only in a relatively inaccurate manner, with the result that exact compliance with programming parameters is not ensured. As a result of these inaccuracies, the specific properties of memory cells of the CBRAM type can be precalculated and complied with during practical operation only in a very inaccurate manner.

Furthermore, memory elements of the CBRAM type and also their operation are also presented in more detail in the article "Can Solid State Electrochemistry Eliminate the Memory Scaling Quandary?" by Kozicky, Mitkova, Zhu, Park and Gopalan, published in 2002 in "Proceedings of IEEE-NANO 2002".

SUMMARY OF THE INVENTION

In one embodiment, the present invention provides a memory cell arrangement having a plurality of memory cells of the CBRAM type and having a programming apparatus, the memory cells being arranged along bit lines and each bit line having a programming apparatus, wherein the programming apparatus has a charge storage device and a switchable charging apparatus.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides a memory cell arrangement which is in a form such that programming operations can be carried out very precisely and in such a manner that they can be accurately repeated, with the result that the abovementioned disadvantages are largely avoided. The present invention also provides a method that is suitable for such programming.

Figure 1:
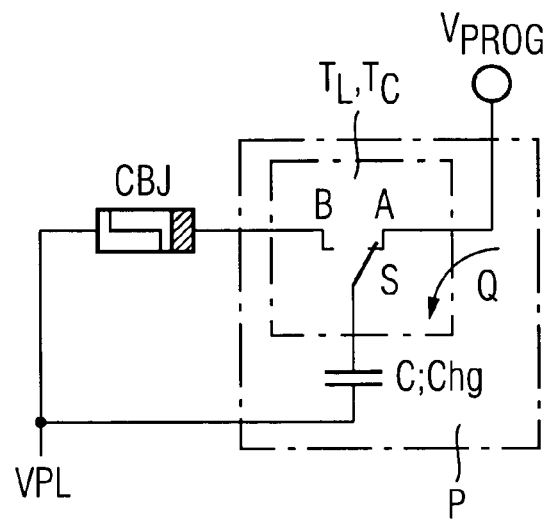
FIGS. 1 and 2 illustrate one embodiment of the present invention in the form of a basic circuit in different circuit states.
Figure 2:
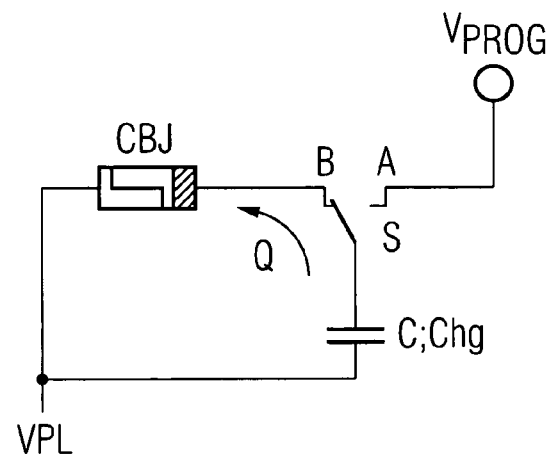

FIGS. 1 and 2 illustrate one embodiment of the present invention in the form of a basic circuit. FIG. 1 illustrates the latter in a first circuit state and FIG. 2 illustrates it in a second circuit state.

In this basic circuit, a programming apparatus P is formed from a charge storage device Chg (comprising a charge capacitance C in this case) and a switchable charging apparatus $T_L$, $T_C$ (illustrated here in the form of a changeover switch S). One switched contact A is connected to a connection of the programming apparatus P for a programming potential $V_{Prog}$, while the other switched contact B is connected to the anode of a memory element CBJ of the CB type. The charge capacitance C is connected, on the one hand, to a further connection (which can be changed over) of the changeover switch S and, on the other hand, together with the cathode of the memory element CBJ, to a given potential VPL. This given potential VPL may, for example, be a "plate potential", as is known from DRAM memory cells.

In the first circuit state illustrated in FIG. 1, a given quantity of charge Q is transferred from the connection for the programming potential $V_{Prog}$ to the charge storage device Chg, with the result that the charge storage device Chg has the given quantity of charge Q after a certain amount of time. This charging process is illustrated in FIG. 1 using an arrow which points from the connection for the programming potential $V_{Prog}$ to the charge storage device Chg.

In a second process (illustrated in FIG. 2), the changeover switch S is then changed over, with the result that the charge storage device Chg is then no longer connected to the connection for the programming potential $V_{Prog}$ but rather to the anode of the memory element CBJ via the other switched contact B of the changeover switch S. As a result of this, the given quantity of charge Q stored in the charge storage device Chg now flows away from the charge storage device Chg to the anode of the memory element CBJ (likewise shown using an arrow in an analogous manner to FIG. 1). If the programming potential $V_{Prog}$ is then considerably more positive than the given potential VPL, ions, for example silver ions, are released in the anode of the memory element CBJ (this process is generally known as such to the specialists responsible for memory elements of the CB type; also cf., in this respect, the specialist article mentioned at the outset), which ultimately leads to a considerable reduction in the nonreactive resistance of the memory element CBJ. When considered in terms of information technology, the memory element CBJ thus assumes a first (memory) state.

If, however, the programming potential $V_{Prog}$ is considerably more negative than the given potential VPL, the previously released silver ions are bound again in the anode of the memory element CBJ (this process is likewise generally known as such to the specialists responsible for memory elements of the CB type; again cf., in this respect, the specialist article mentioned at the outset), which then leads to a considerable increase in the nonreactive resistance of the memory element CBJ. When again considered in terms of information technology, the memory element CBJ thus assumes a second (memory) state.

As already described at the outset, programming memory elements of the CB type runs the high risk, in the event of a change from a high nonreactive resistance to a low nonreactive resistance, of the current (which flows in this case) suddenly increasing and resulting in destruction of the memory element if current-limiting means are not provided in order to limit the current. However, in practice, such current-limiting means always have limit values which have only an imprecise effect. Relatively recent investigations have now shown that it is not the flow of current as such that is decisive for the magnitude of the nonreactive resistance of the memory elements of the CB type but rather the quantity of charge that is transferred to the memory element CBJ or is removed from the latter in the process ($Q_{Prog}=C \cdot V_{Prog}$ where $Q_{Prog}$=quantity of charge, C=storage capacitance, for example of a capacitor, $V_{Prog}$=programming potential). This effect is used in the present invention to the effect that the quantity of charge to be transferred can be set exactly by accurately dimensioning the charge storage device Chg and the programming potential $V_{Prog}$. As a result, an impermissibly high current cannot occur.

Figure 3:
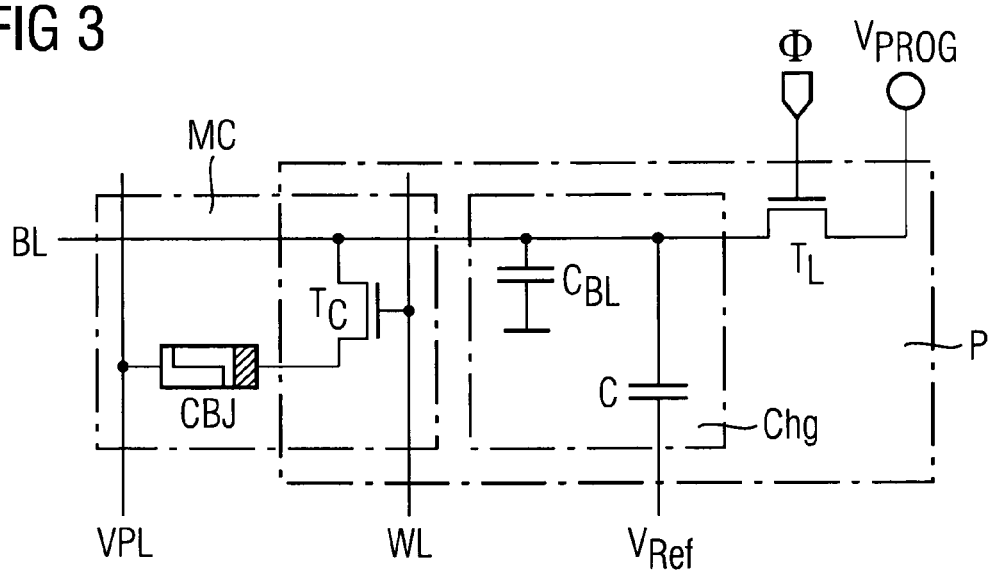
FIG. 3 illustrates one embodiment of a specific circuit implementation of the inventive memory cell arrangement.

FIG. 3 illustrates one advantageous embodiment of this inventive memory cell arrangement. FIG. 3 illustrates the circuit that is already known from FIGS. 1 and 2 but with a special implementation of the changeover switch S: the latter is now implemented using a charging transistor $T_L$, and using a selection transistor $T_C$ for each memory cell MC (only one single memory cell MC is illustrated in FIG. 3). As far as the memory cell MC is concerned, the selection transistor $T_C$ has the same function as a selection transistor in a known dynamic 1T-1C memory cell. In addition, it still carries out part of the changeover function of the changeover switch S known from FIGS. 1 and 2. A memory cell MC thus comprises a memory element CBJ of the CB type and a selection transistor $T_C$. The selection transistor $T_C$ is driven using a word line WL in the memory cell arrangement. Furthermore, it is also connected to a bit line BL in the memory cell arrangement, as is already known from dynamic semiconductor memory cells.

The charging transistor $T_L$ can be driven using a charging signal $\Phi$. It is arranged between the bit line BL and the connection for the programming potential $V_{Prog}$. The bit line capacitance $C_{BL}$ that is intrinsically inherent in each bit line BL is likewise illustrated in FIG. 3, since it can also be used as part of the charge storage device Chg in an advantageous development of the invention.

Figure 4:
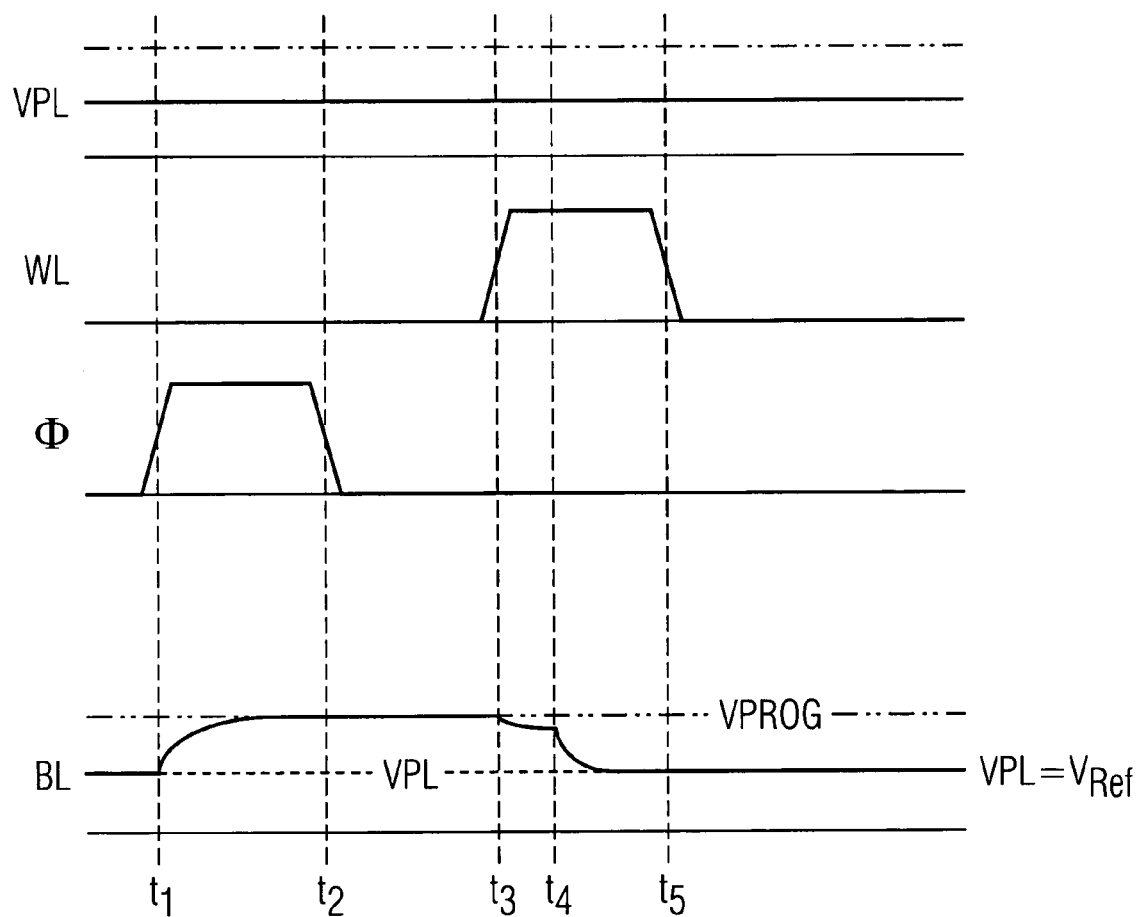
FIGS. 4 and 5 illustrate timing diagrams on the basis of which the inventive memory cell arrangement can be programmed.

One embodiment of an inventive method for programming a memory cell MC of the CBRAM type, namely for writing information to the latter, will be described below with reference to the timing diagram illustrated in FIG. 4 and with reference to the memory cell arrangement illustrated in FIG. 3. During the entire process, a given potential VPL, which is already known from dynamic semiconductor memory cells and is referred to there as the plate potential or else, depending on the absolute value, as the center potential, is applied to the cathode of the memory element CBJ. The bit line BL also has this given potential VPL. One electrode (which is remote from the charging transistor $T_L$) of the charge capacitance C is connected to a reference-ground potential $V_{Ref}$, the value of which cannot be changed and, in this case, is the value of the given potential VPL.

The word line WL is still deactivated, as is the charging signal $\Phi$. In a first step, a given quantity of electrical charge Q (the quantity is defined by the capacitance of the charge storage device Chg and the value of the programming potential $V_{Prog}$, relative to the reference-ground potential $V_{Ref}$) is now stored in the charge storage device Chg. In the circuit arrangement shown in FIG. 3, the charge storage device Chg is formed from the charge capacitance C and the bit line capacitance $C_{BL}$ that is inherently present in each bit line BL. In order to store this electrical charge Q, the charging transistor $T_L$ is electrically turned on at a first point in time $t_1$ by activating the charging signal $\Phi$. As a result, the requisite charge Q can flow from the connection for the programming potential $V_{Prog}$ to the charge storage device Chg. At a point in time $t_2$, at which it is then ensured that the entire requisite electrical charge Q is in the charge storage device Chg, the charging transistor $T_L$ is electrically turned off again by deactivating the charging signal $\Phi$. At this point in time, the bit line BL has assumed the potential value of the programming potential $V_{Prog}$.

In a second process, the stored electrical charge Q is then transferred to the memory cell, i.e., to the memory element CBJ in the present case. In the method based on the timing diagram illustrated in FIG. 4, this is effected in such a manner that, at a third point in time $t_3$, the word line WL associated with the memory cell MC to be programmed is activated. As a result, the selection transistor $T_C$ is used to produce an electrically conductive connection between the bit line BL (and thus the charge storage device Chg) and the memory element CBJ, with the result that the charge Q stored in the charge storage device Chg is transferred to the memory element CBJ.

If the potential which is established at the anode of the memory element CBJ as a result of the charge Q that has been transferred is sufficiently larger than the given potential VPL applied to the cathode of the memory element CBJ, the process (already described in the article mentioned at the outset) of ions, for example silver ions, forming on the anode, becoming detached from the latter and drifting in the direction of the cathode now occurs. This then reduces the nonreactive resistance between the anode and the cathode by orders of magnitude. The nonreactive resistance is initially reduced relatively slowly (in FIG. 4: up until the point in time $t_4$) and then very rapidly (in FIG. 4: between the points in time $t_4$ and $t_5$), with the result that the potential applied to the bit line BL ultimately assumes the value of the reference-ground potential $V_{Ref}$. The memory element CBJ now has a low nonreactive resistance which may also be referred to as "log.1". At the point in time $t_5$, the word line WL is deactivated again; programming of the memory cell MC has been concluded.

If, by contrast, during programming, the potential which is established at the anode of the memory element CBJ as a result of the charge Q that has been transferred is sufficiently smaller than the given potential VPL applied to the cathode of the memory element CBJ, the process (likewise already described in the article mentioned at the outset) of a substantial part of the ions, for example silver ions, which are situated in the region between the anode and cathode of the memory element CBJ drifting back in the direction of the anode, being connected to the anode material again on said anode and being deposited there now occurs. This then increases the nonreactive resistance between the anode and the cathode by the orders of magnitude which have already been disclosed. As a result, the memory element CBJ then has a very high nonreactive resistance again, which can then also be referred to as "log.0".

In the above-described first embodiment of the inventive method, it was assumed that that connection of the charge capacitance C which is remote from the charging transistor $T_L$ is connected to a reference-ground potential $V_{Ref}$ having a constant value. However, in a second embodiment of the inventive method, it is also possible to vary the value of this reference-ground potential $V_{Ref}$ over time. It is also additionally assumed in this case that the reference-ground potential $V_{Ref}$ is initially smaller than the given potential VPL. This will be explained in more detail below with reference to the timing diagram shown in FIG. 5.

Figure 5:
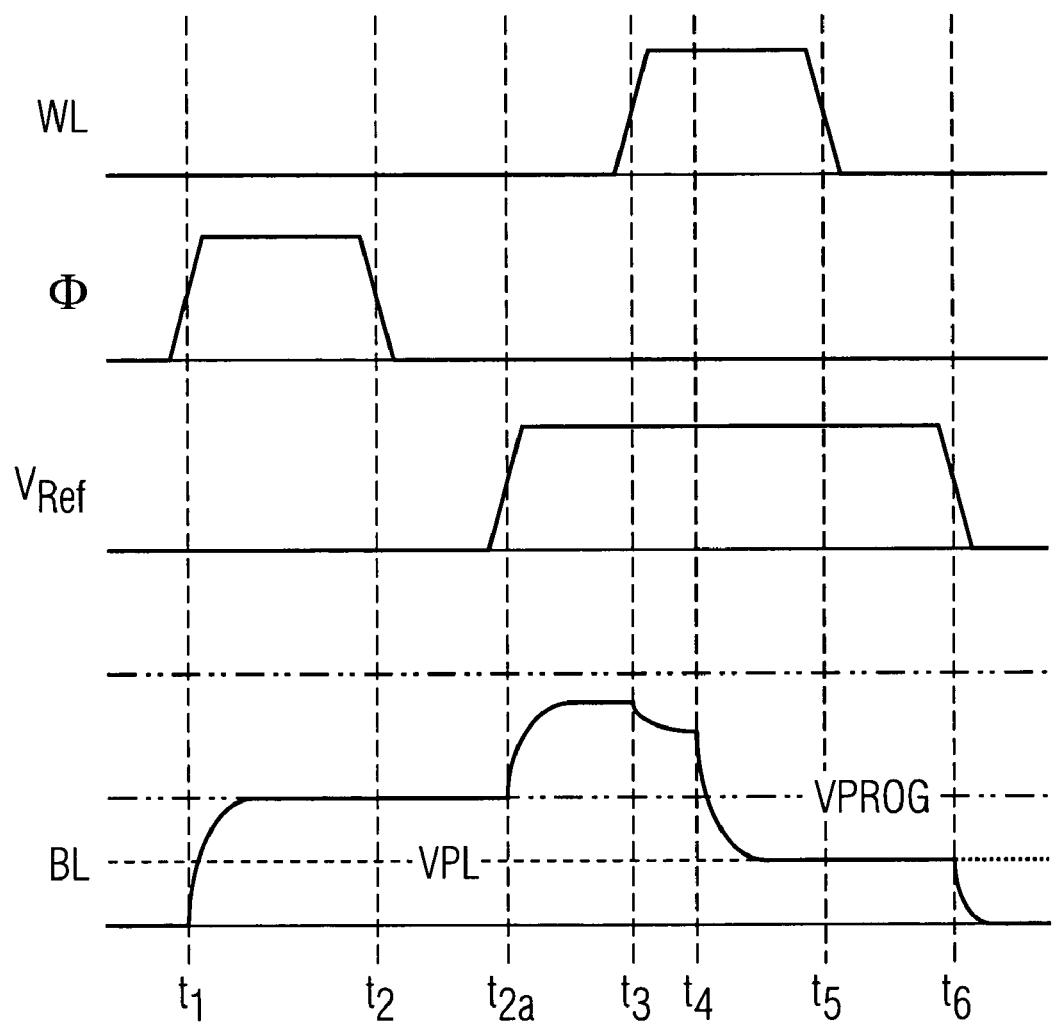

The first process of the method according to this second embodiment initially proceeds as in the method according to the first embodiment: at the point in time $t_1$, the charging transistor $T_L$ is electrically turned on by activating the charging signal Φ, with the result that the bit line BL and the charge capacitance C are connected to the programming potential $V_{Prog}$. The charge storage device Chg is thus charged. At a point in time $t_{2a}$, still within the first step but after the charging signal Φ has been deactivated, i.e., after the second point in time $t_2$, the value of the reference-ground potential $V_{Ref}$ applied to one electrode of the charge capacitance C is then changed, for example increased. As a result, a boosting operation that is generally known as such takes place on the bit line BL and in the charge capacitance C, i.e., the value of the potential applied in this case is changed, in particular increased, as illustrated in FIG. 5.

This has the particular advantage that the entire programming operation as such can be carried out in a more rapid manner at excessive potential levels.

This boosting operation is then followed by the second process which, as regards the points in time $t_3$, $t_4$ and $t_5$ which have already been described, is initially carried out in the same manner as in the first embodiment of the inventive method. Shortly before the end of the second process, after the fifth point in time $t_5$, the reference-ground potential $V_{Ref}$ is returned to its original value again at a point in time $t_6$. The second process has thus also then been concluded.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell arrangement comprising:
   a plurality of memory cells of a CBRAM type;
   a programming apparatus, the memory cells being arranged along bit lines, each bit line having a programming apparatus, the programming apparatus having a charge storage device and a switchable charging apparatus, wherein the switchable charging apparatus has a charging transistor and a plurality of selection transistors.

2. The memory cell arrangement of claim 1, comprising:
   wherein the programming apparatus includes a connection for a programming potential.

3. The memory cell arrangement of claim 1, comprising:
   wherein the charging transistor is configured to be switched using a charging signal.

4. The memory cell arrangement of claim 2, comprising wherein a respective one of the selection transistors is part of a respective memory cell.

5. The memory cell arrangement of claim 1, comprising wherein a respective one of the selection transistors can be selected using a word line.

6. A memory cell arrangement comprising:
   a plurality of memory cells of a CBRAM type;
   a programming apparatus, the memory cells being arranged along bit lines, each bit line having a programming apparatus, the programming apparatus having a charge storage device and a switchable charging apparatus, wherein the switchable charging apparatus has a charging transistor and a plurality of selection transistors; wherein the bit lines inherently each have a bit line capacitance, and wherein the charge storage device associated with a bit line is formed from the bit line capacitance and a charge capacitance.

7. The memory cell arrangement of claim 6, comprising wherein one connection of the charge capacitance is connected to a reference-ground potential.

8. The memory cell arrangement of claim 7, comprising wherein the reference-ground potential is a potential whose value is fixed.

9. The memory cell arrangement of claim 7, comprising wherein the reference-ground potential is a potential whose value can be changed.

10. A method for programming memory cells of the CBRAM type, comprising:
    storing a given quantity of an electrical charge in a charge storage device; and
    transferring the stored quantity of electrical charge to a memory cell to be programmed, thereby
    using a charging signal to electrically turn on a charging transistor at a first point in time, with the result that the charge storage device is electrically connected to a programming potential in order to be charged, and
    wherein the charging transistor is electrically turned off again at a second point in time when the charge storage device has the given quantity of electrical charge.

11. The method of claim 10, comprising:
    transferring the quantity of electrical charge stored in the charge storage device to the memory cell as of a third point in time.

12. The method of claim 10, comprising:
    wherein after the second point in time, raising the potential at which the bit line currently lies using charge displacement.

13. A method for programming memory cells of the CBRAM type, comprising:
    storing a given quantity of an electrical charge in a charge storage device;
    using a charging signal to electrically turn on a charging transistor at a first point in time, with the result that the charge storage device is electrically connected to a programming potential in order to be charged, and wherein the charging transistor is electrically turned off again at a second point in time when the charge storage device has the given quantity of electrical charge; and
    transferring the stored quantity of electrical charge to a memory cell to be programmed, including transferring the quantity of electrical charge stored in the charge storage device to the memory cell as of a third point in time.

14. The method of claim 13, comprising:
    wherein after the second point in time, raising the potential at which the bit line currently lies using charge displacement.

\* \* \* \* \*